(12) United States Patent
Miyoshi

(10) Patent No.: US 6,717,192 B2
(45) Date of Patent: Apr. 6, 2004

(54) SCHOTTKY GATE FIELD EFFECT TRANSISTOR

(75) Inventor: Yosuke Miyoshi, Kawasaki (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 10/337,107

(22) Filed: Jan. 6, 2003

(65) Prior Publication Data

US 2003/0132463 A1 Jul. 17, 2003

(30) Foreign Application Priority Data

Jan. 8, 2002 (JP) .................................. 2002-001241

(51) Int. Cl.⁷ .............................................. H01L 29/80
(52) U.S. Cl. ...................................... 257/280; 257/488
(58) Field of Search .................... 257/280, 472, 257/488, 630

(56) References Cited

U.S. PATENT DOCUMENTS 5,072,264 A * 12/1991 Jones ........................ 357/22
6,100,571 A 8/2000 Mizuta et al. ............... 257/488
6,355,951 B1 * 3/2002 Hattori ....................... 257/280
2002/0043697 A1 4/2002 Hirokawa et al. ........... 257/472
2002/0171096 A1 * 11/2002 Wakejima et al. .......... 257/280

FOREIGN PATENT DOCUMENTS

| EP | 0792028 | 8/1997 | ............. H04B/1/48 |
| JP | 2000-100831 | 4/2000 | ......... H01L/21/338 |
| JP | 2002-118122 | 4/2002 | ......... H01L/21/338 |

* cited by examiner

Primary Examiner—Mark V. Prenty
(74) Attorney, Agent, or Firm—Hayes Soloway P.C.

(57) ABSTRACT

A Schottky gate FET including a gate electrode having a gate extension, a drain electrode and a drain contact layer overlying a semi-insulating substrate, wherein the gate extension overlies at least part of the drain electrode and the drain contact layer. The vertical overlapping between the gate extension and the drain contact region prevents the current reduction to make the circuit module mounting the Schottky gate FET non-usable.

5 Claims, 7 Drawing Sheets

SCHOTTKY GATE FIELD EFFECT TRANSISTOR

BACKGROUND OF THE INVENTION

1. Field of the Invention

The present invention relates to a Schottky gate field effect transistor (hereinafter referred to as "Schottky gate FET"), more specifically to a high-output-power Schottky gate FET for use in a higher frequency range.

2. Description of the Related Art

The mobility of GaAs is five to six times higher than in Si and the peak value of the saturated drift velocity of the electron transfer of the GaAs is about twice in Si. A semi-insulating substrate can be obtained by using the GaAs. The Schottky gate FET using the GaAs takes advantage of such features, and thus has been developed, while replacing an electron tube, as an active device used in the microwave band which is difficult to be realized by using the Si. Currently, the strong demand has been raised for the Schottky gate FET having a higher output power and operating in a higher frequency range. However, in the Schottky gate FET, the distortion characteristic is degraded during operation for an excessive input power. The Schottky gate FET for solving the above degradation is proposed in JP-A-2002-118122.

As shown in FIGS. 1A and 1B, the Schottky gate FET described in JP-A-2002-118122 includes a buffer layer 22, a channel layer 23, a source contact layer 24a and a drain contact layer 24b sequentially overlying a semi-insulating GaAs substrate 21. In and over the recess formed by removing part of the contact layers 24a and 24b, a gate electrode 25 having a T-shaped gate extension 26 and being in Schottky contact with the channel layer 23, and a source electrode 28 and a drain electrode 27 are formed. The gate extension 26 is in Schottky contact with the channel layer 23 and further extends toward above the drain, and each of the electrodes 27, 28 is in ohmic contact with the contact layers 24a and 24b. Part of the gate electrode 25, the contact layers 24a and 24b, the source electrode 28 and the drain electrode 27 are covered with a dielectric film 29.

In the structure shown in FIG. 1A, the following relationship (1) is satisfied between the length "Lgd" of the field plate section 26 and the distance "Lrgd" from the end of the recess near to the drain side to the point where the gate electrode 25, the dielectric film 29 and the channel layer 23 are in contact with one another.

$$Lgd = Lrgd \pm 400 \text{ nm} \quad (1)$$

The length "Lgd" of the gate extension 26 is defined by the distance between the end of the gate electrode 25 near to the drain electrode 27 and the point where the gate electrode 25, the dielectric film 29 and the channel layer 23 are in contact with one another.

In the Schottky gate FET having thereon the gate extension wherein the above relationship is satisfied, the distortion generated by the excessive output power can be reduced. However, the following inconvenience may take place if the below relationship is satisfied.

$$Lgd = Lrgd - X \quad (0 \leq X \leq 400 \text{ nm})$$

More specifically, the current is reduced after the operation of the transistor at the excessive power if the gate extension 26 overlies the drain contact layer 24b. This phenomenon can be hardly suppressed.

SUMMARY OF THE INVENTION

It is therefore an object of the present invention to provide a Schottky gate FET capable of effectively suppressing the phenomenon of current reduction after the operation of the transistor at the excessive power.

Thus, the present invention provides, in a first aspect thereof, a Schottky gate FET including a semi-insulating substrate, a channel layer overlying the semi-insulating substrate, a source contact layer and a drain contact layer formed on the channel layer and having a recess formed by removing part of the contact layers, a gate electrode formed over the recess and being in Schottky contact with the channel layer, a source electrode and a drain electrode in ohmic contact with the source contact layer and the drain contact layer, respectively, and a dielectric film formed between the gate electrode and the drain electrode, wherein the gate electrode includes a gate extension which is in contact with the dielectric film and extend to overlie at least part of the drain electrode and the drain contact layer.

The present invention provides, in a second aspect thereof, a Schottky gate FET including a semi-insulating substrate, a channel layer overlying the semi-insulating substrate, a source contact layer and a drain contact layer formed on the channel layer and having a recess formed by removing part of the contact layers, a gate electrode formed over the recess and being in Schottky contact with the channel layer, a field plate separated from the gate electrode and electrically connected thereto, a source electrode and a drain electrode in ohmic contact with the source contact layer and the drain contact layer, respectively, and a dielectric film formed between the gate electrode and the drain electrode, wherein the field plate overlies at least part of the drain electrode and the drain contact layer sandwiching the dielectric film.

In accordance with the Schottky gate FET of the present invention, since the gate extension or the field plate overlies at least part of the drain contact layer and the drain electrode, the phenomenon can be suppressed that the dielectric film is charged in a negative polarity due to the electrons injected into the dielectric film around the gate extension or the field plate during the operation at an excessive output power to reduce the current after the transistor operation. In this manner, an inconvenience can be averted that the operation of the circuit module mounting the Schottky gate FET departs from the rating to prevent the circuit module from non-usable. Further, in the second aspect, the parasitic capacitance between the field plate and the channel layer can be reduced.

The above and other objects, features and advantages of the present invention will be more apparent from the following description.

PREFERRED EMBODIMENTS OF THE INVENTION

Now, the present invention is more specifically described with respect to preferred embodiments of the present invention.

First Embodiment

Figure 1A:
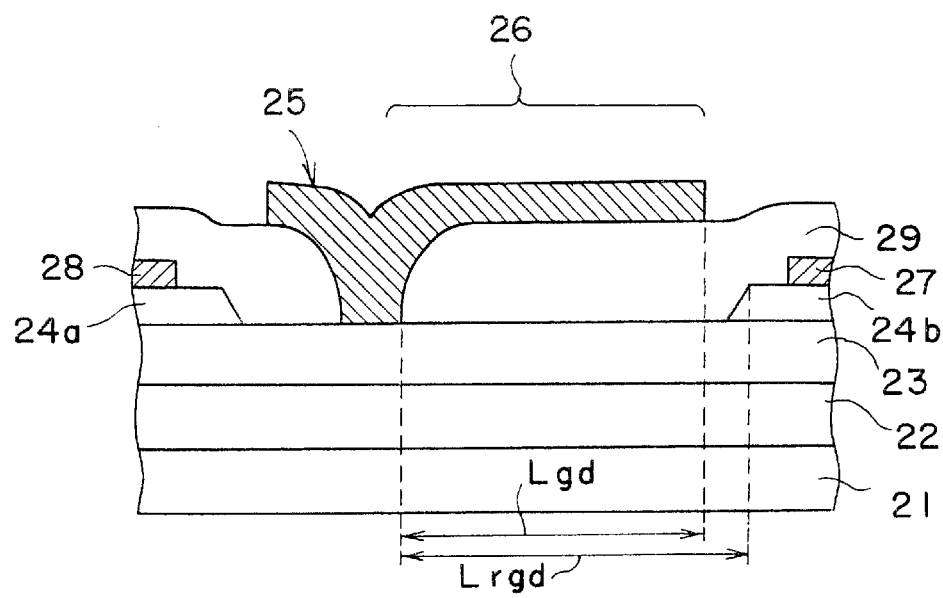
FIG. 1A is a sectional view showing an example of a Schottky gate FET.
Figure 1B:
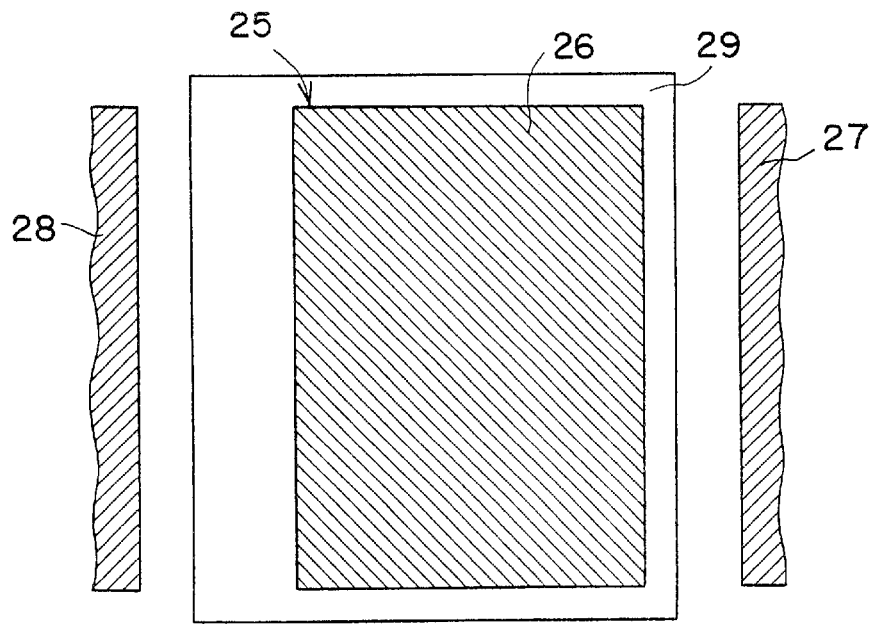
FIG. 1B is a top plan view thereof.
Figure 2A:
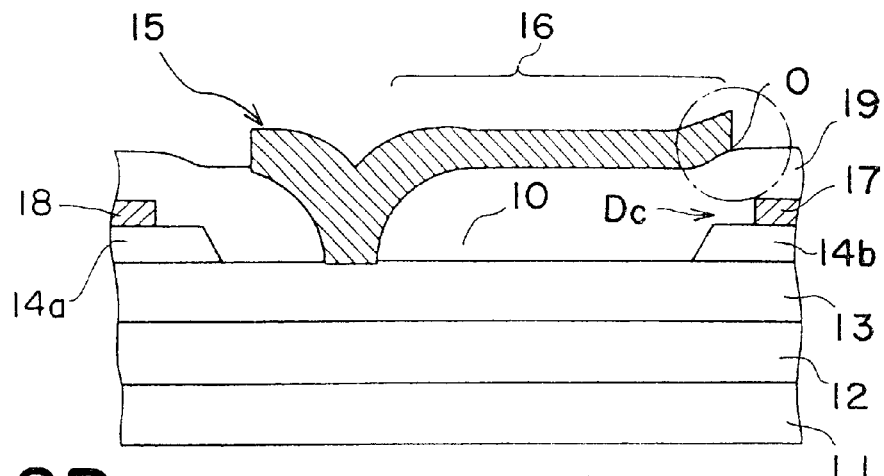
FIG. 2A is a sectional view showing a Schottky gate FET in accordance with a first embodiment of the present invention.
Figure 2B:
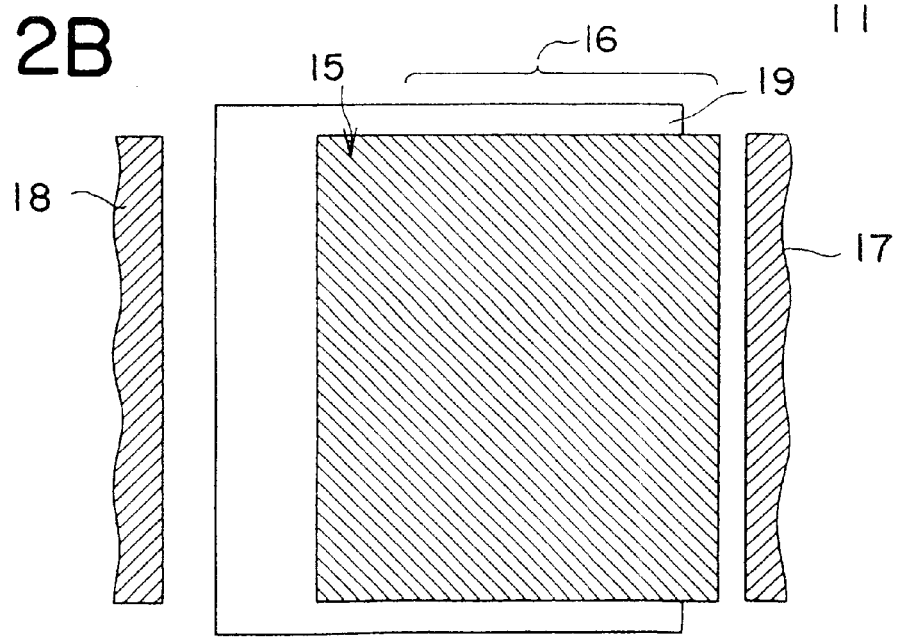
FIG. 2B is a top plan view thereof.

As shown in FIGS. 2A and 2B, a Schottky gate FET includes a buffer layer 12, a channel layer 13, a source contact layer 14a and a drain contact layer 14b sequentially overlying a semi-insulating GaAs substrate 11. A gate electrode 15 in Schottky contact with the channel layer 13, and a source electrode 18 and a drain electrode 17 are formed in and over the recess 10 formed by removing part of the contact layers 14a and 14b.

The gate electrode 15 includes a T-shaped gate extension (field plate) 16 extending toward the drain electrode 17. The gate extension 16 is positioned such that the gate extension 16 is vertically overlapped with part of a drain contact region "Dc" including the drain contact layer 14b and the drain electrode 17. The end of the gate extension 16 near to the drain contact region "Dc" is separated from both of the drain electrode 17 and the drain contact layer 14b by 2.5 μm or more, and preferably by 3.0 μm or more. None of drain electrode 17 and the drain contact layer 14b exist in a circle having, at the end of the gate extension 16 near to the drain electrode, a center "O" with a radius of 2.5 μm, and preferably 3.0 μm.

Figure 3:
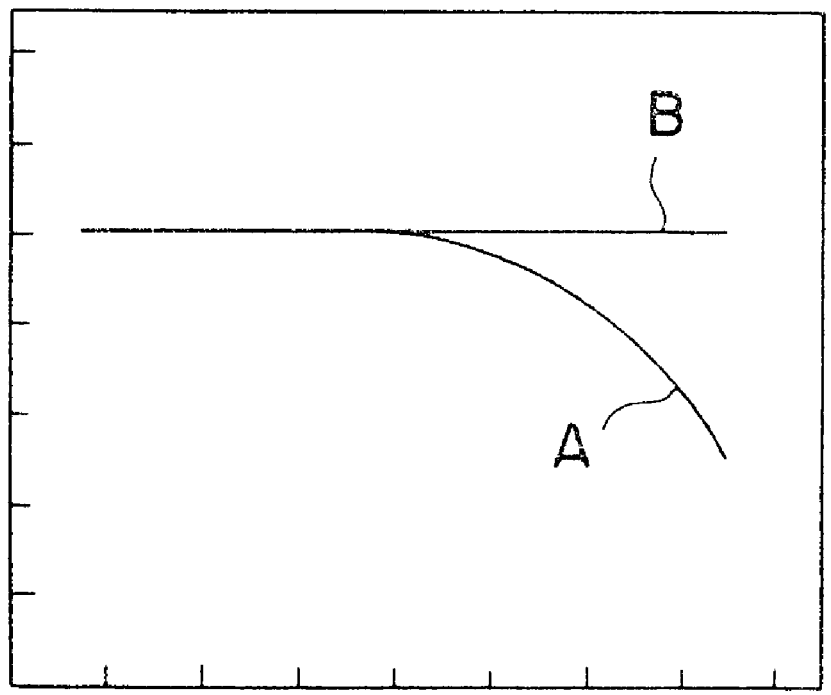
FIG. 3 is a graph showing the correlation between input excessive power and current after the operation of the transistor at the excessive power.

As shown in the graph of FIG. 3, a curve "A" shows the measured relationship between the input excessive power and the current in which the gate extension 16 is not vertically overlapped with the drain contact region "Dc", while a curve "B" shows the measured relationship of the present embodiment. It is apparent from these results that the performance change is efficiently suppressed or the current reduction after the operation of the transistor at the excessive power input is efficiently suppressed in the present embodiment by vertically overlapping the gate extension 16 with at least part of the end of the drain contact region "Dc" near to the gate electrode 15.

In the present embodiment, the resistance to the external noise such as surge in addition to the effect of suppressing the performance change can be improved because the end of the gate extension 16 near to the drain contact region "Dc" is separated from both of the drain electrode 17 and the drain contact layer 14b by 2.5 μm or more, and preferably by 3.0 μm or more.

Then, a method of fabricating the Schottky gate FET of the present embodiment will be described referring to FIGS. 4A to 4C.

Figure 4A:
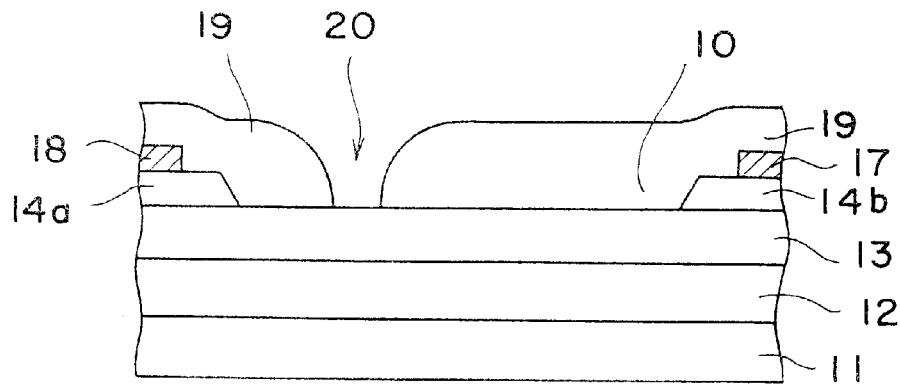
FIGS. 4A to 4C sequentially show each of the steps of fabricating the Schottky gate FET of the first embodiment.

At first, as shown in FIG. 4A, the buffer layer 12, the channel layer 13, and the n+GaAs contact layers are sequentially formed on the GaAs substrate 11.

After patterning of photomask (not shown) by using photolithography technique, the recess 10 is formed by etching the n+GaAs contact layers by using the patterned photomask, thereby producing the source contact layer 14a and the drain contact layer 14b. Further, the source electrode 18 and the drain electrode 17 both acting as an ohmic electrode are formed on the source contact layer 14a and the drain contact layer 14b, respectively.

The formation of the layer structure is generally conducted by using the epitaxial growth employing the MOCVD method or the MBE method. The formation of the ohmic electrode is generally conducted by using the lift-off process employing a photomask. The contact resistance between the electrode and the semiconductor is reduced by thermally alloying the interface between the electrode and the semiconductor after the electrode materials are evaporated on the source contact layer 14a and the drain contact layer 14b.

Then, the dielectric film 19 is formed on the channel layer 13 including the contact layers 14a, 14b and the electrodes 18, 17. After a photomask (not shown) is evaporated on the dielectric film 19, an opening 20 is formed by removing part of the dielectric film 19 on the recess 10 by using the photomask. The dielectric film 19 is generally made of the material such as $SiO_2$ and $SiN_x$ by using the CVD method. The material is not especially restricted thereto if it has the electric resistance higher than the specific value.

The opening 20 has a striped shape extending perpendicular to the surface of the drawing and has substantially the same size as the gate of the FET. The size of the FET is determined depending on the use thereof. For example, the length or the lateral distance in FIG. 4A is 0.05 to 1.5 μm, and the width or the length of the perpendicular direction is 100 to 500 μm.

Figure 4B:
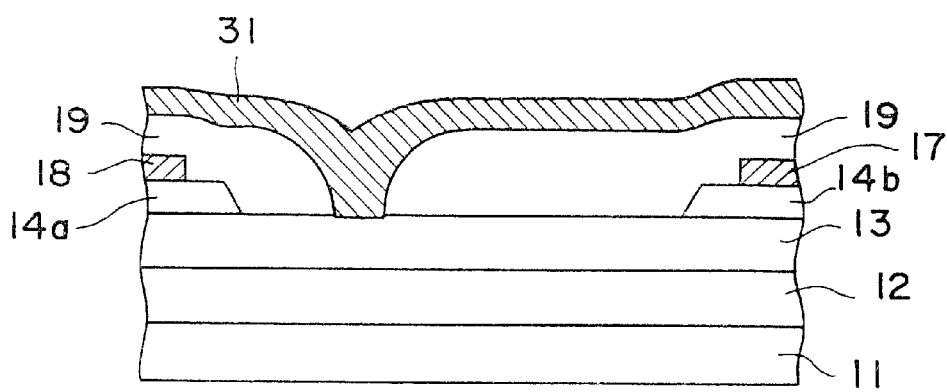
Figure 4C:
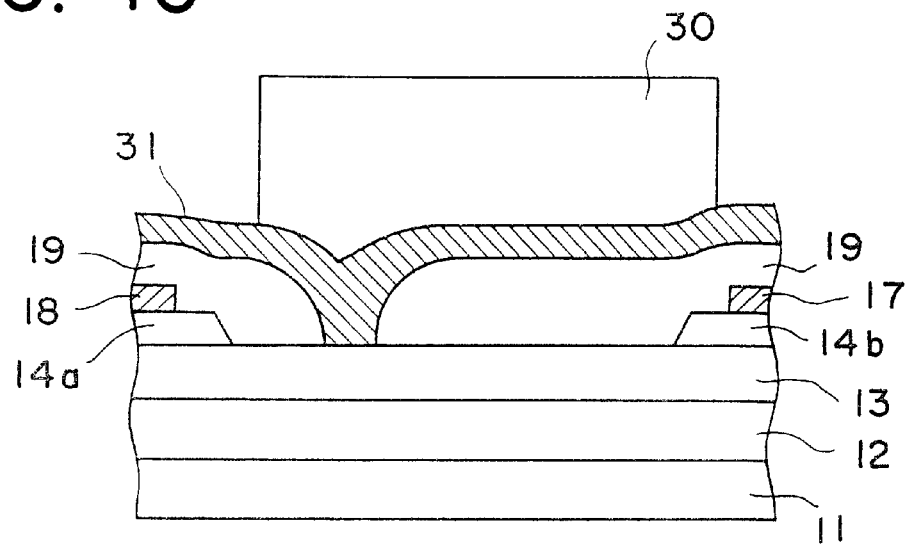

Then, as shown in FIG. 4B, a metal film 31 is formed on the dielectric film 19 including the opening 20. Then, as shown in FIG. 4C, after a photomask 30 is evaporated on the metal film 31, the gate electrode 15 having the field gate section 16 as shown in FIG. 2 is formed by conducting the ion milling or the dry etching for patterning the metal film 31 by using the photomask 30. The fabrication of the Schottky gate FET is completed after the removal of the photomask 30 on the gate electrode 15 and the formation of the desired interconnect.

A layer film prepared by sequentially forming titanium (Ti), platinum (Pt) and gold (Au) on tungsten silicide (WSi) which is a refractory compound can be used as a material of the gate electrode 15. However, the material is not restricted thereto if the material can be in Schottky contact with the nGaAs channel layer 13. When the method conducted in relatively lower temperature can be used in the formation of the gate electrode 15, the above lift-off process can be similarly employed.

The order of the above steps can be changed for forming the gate electrode 15, the source electrode 18 and the drain electrode 17. That is, after the opening is formed by removing, by means of the etching using a photomask, the dielectric film 19 on the source contact layer 14a and the drain contact layer 14b positioned on both sides of the gate electrode 15, the source electrode and the drain electrode can be formed through the opening.

In case that the dielectric film 19 is thin enough to reduce the etching amount thereof for making the opening, the wet etching using hydrofluoric acid (HF) or buffered hydrofluoric acid (BHF) can be conveniently employed. On the other hand, in case that the dielectric film 19 is thick enough to increase the etching amount thereof, the dry etching including the reactive ion etching (RIE) using $CF_4$ plasma for obtaining the specified vertical shape can be employed. The change of the order of the other steps is possible without departing from the scope of the present invention.

Second Embodiment

Figure 5A:
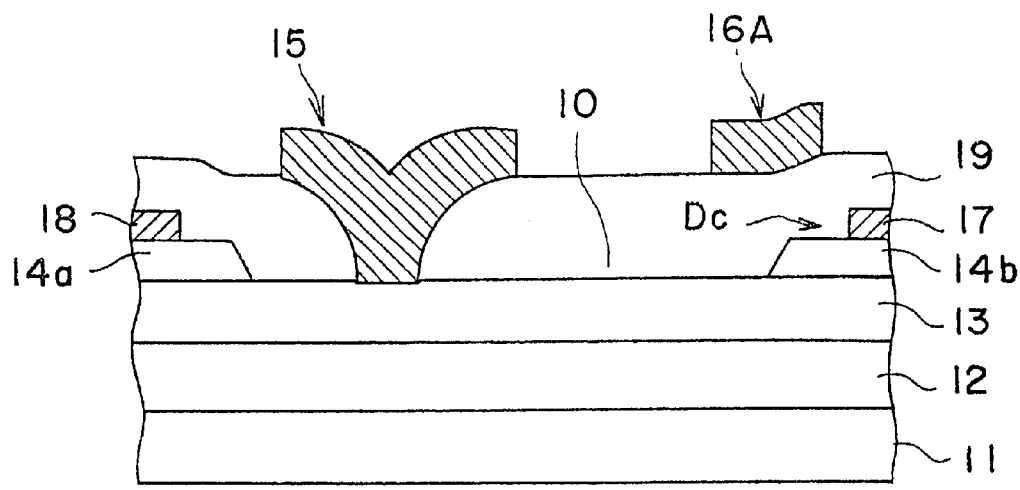
FIG. 5A is a sectional view showing a Schottky gate FET in accordance with a second embodiment of the present invention.
Figure 5B:
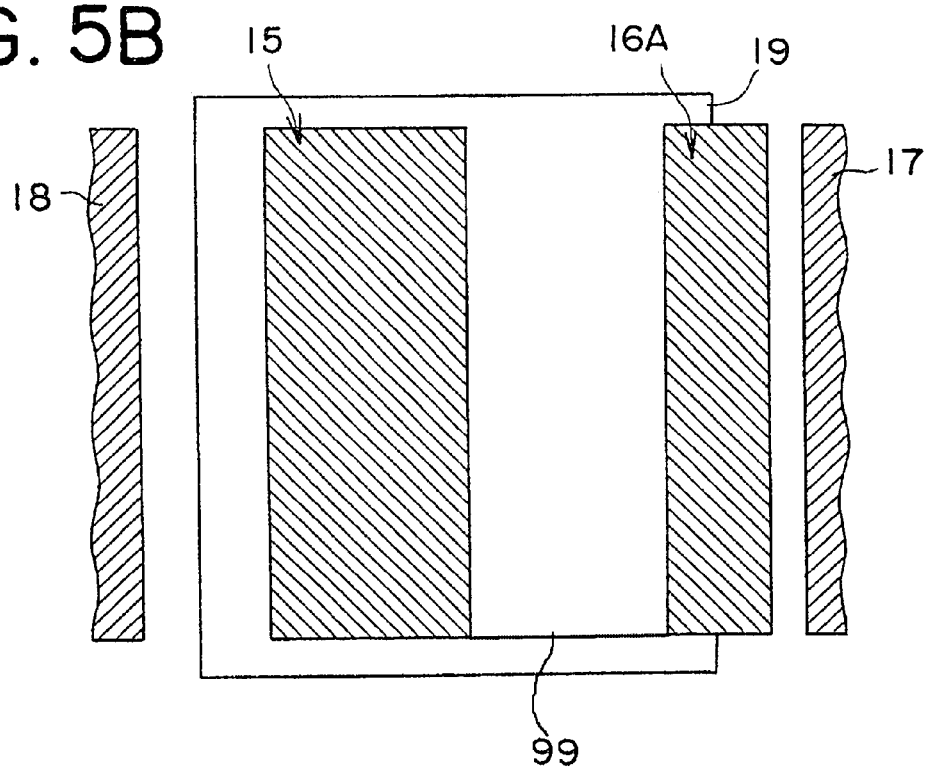
FIG. 5B is a top plan view thereof.

As shown in FIGS. 5A and 5B, in the Schottky gate FET of the present embodiment, the central section of the gate extension 16 of the first embodiment is removed so that a field plate 16A is independently mounted on the dielectric film 19. To the field plate 16A is applied a potential similar to the potential applied to the gate electrode 15 through an interconnect, e.g., interconnect 99. Similarly to the first embodiment, the end of the separated field plate 16A of the second embodiment near to the drain contact region "Dc" is also separated from both of the drain electrode 17 and the drain contact layer 14b by 2.5 μm or more, and preferably by 3.0 μm or more.

Since the Schottky gate FET of the present embodiment has the field plate 16A separated from the gate electrode 15, the effect of reducing the parasitic capacitance between the field plate 16A and the channel layer 13 can be obtained in addition to the effects of the first embodiment. The Schottky gate FET of the present embodiment can be fabricated by changing the pattern of the photomask 30 shown in FIG. 4C, or separately fabricated from the gate electrode 15 by using the lift-off method.

Third Embodiment

Figure 6A:
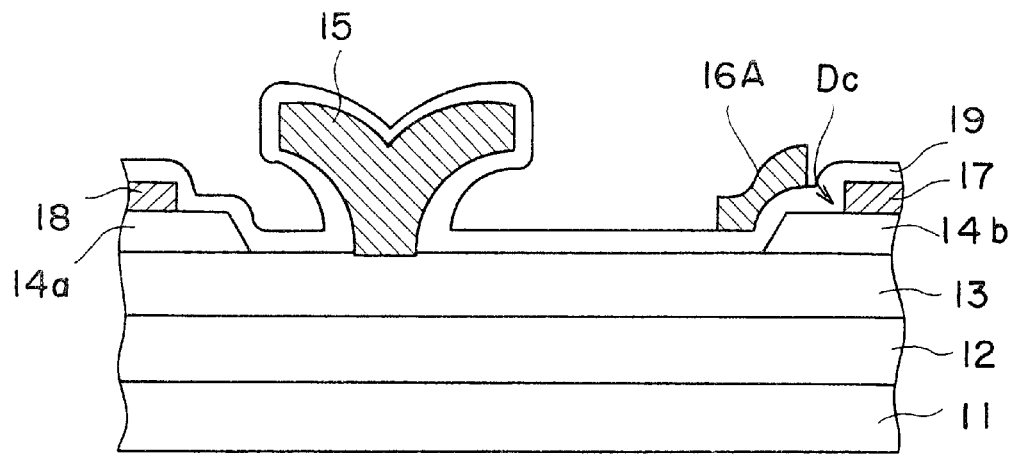
FIG. 6A is a sectional view showing a Schottky gate FET in accordance with a third embodiment of the present invention.
Figure 6B:
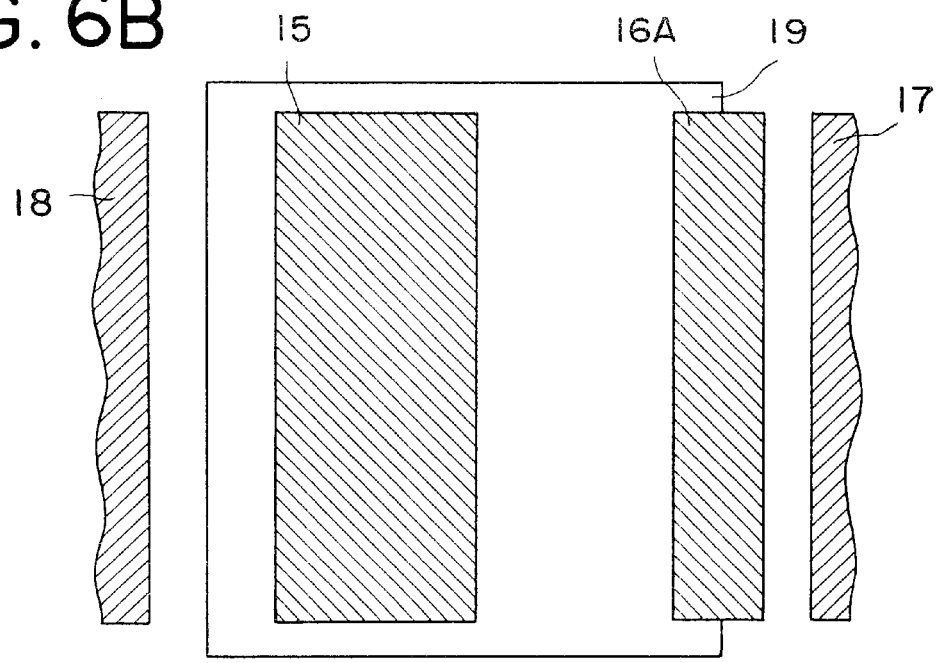
FIG. 6B is a top plan view thereof.

As shown in FIGS. 6A and 6B and similarly to the second embodiment, in the Schottky gate FET of the present embodiment, the separated field plate 16A is separated from the gate electrode 15. However, the thickness of the dielectric film 19 immediately below the field plate 16A is thinner than that shown in FIG. 5A, or the thickness is 50 to 200 nm, for example. Therefore, in addition to the effects of the second embodiment, the effect of suppressing the phenomenon of reducing the current after the operation at the excessive power is further increased so that the current reduction can be prevented even if the further excessive power is input.

Further, in the present embodiment, the drain electrode 17 and the drain contact layer 14b can be formed by moving the positions thereof to the right-hand direction in FIG. 6A. Also, in this case, the end of the field plate 16A near to the drain contact region "Dc" can be separated from both of the drain electrode 17 and the drain contact layer 14b by 2.5 μm or more, and preferably by 3.0 μm or more.

Then, a method of fabricating the Schottky gate FET of the present embodiment will be described referring to FIGS. 7A to 7C.

Figure 7A:
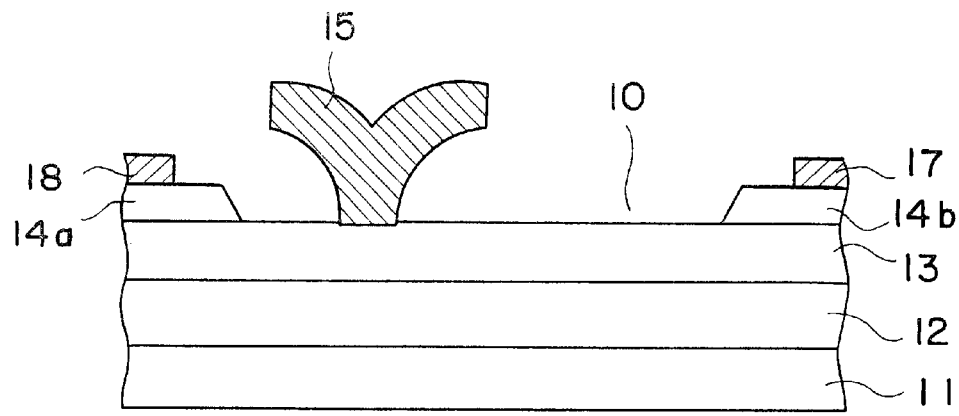
FIGS. 7A to 7C sequentially show each of the steps of fabricating the Schottky gate FET of the third embodiment.

Similarly to the first embodiment, as shown in FIG. 7A, after the buffer layer 12, the channel layer 13, and the n+GaAs contact layers are sequentially formed on the GaAs substrate 11, the recess 10 is formed. After the source contact layer 14a, the drain contact layer 14b, the source electrode 18 and the drain electrode 17 are formed, the dielectric film (not shown) is formed on the channel layer 13 including the contact layers 14a, 14b and the electrodes 18, 17. After the opening is photolithographically formed through the dielectric film, the gate electrode 15 in Schottky contact with the channel layer 13 through the opening is formed, similarly to FIGS. 5A and 5B.

Then, the dielectric film around the gate electrode 15 is peeled off by etching such as the wet etching using the hydrofluoric acid or the buffered hydrofluoric acid, gas etching using the gas of these acids or the other reactive ion etchings.

Figure 7B:
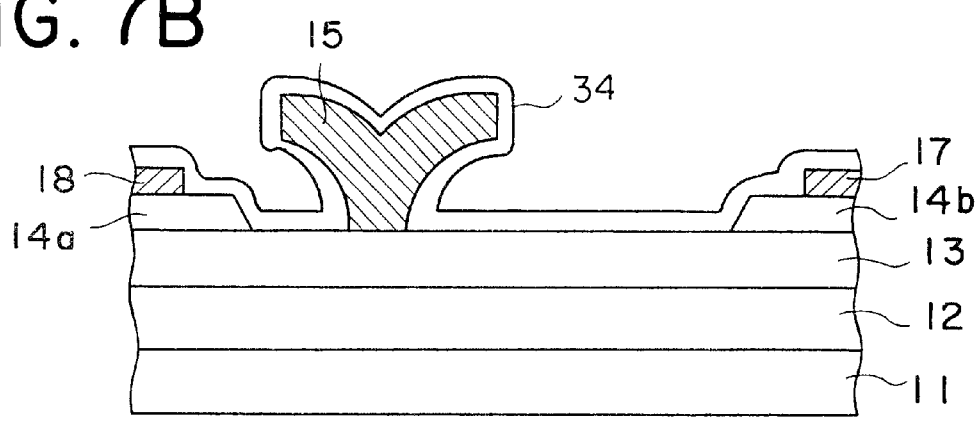

Then, as shown in FIG. 7B, a dielectric film 31 is formed on the channel layer 13 including the whole surface of the gate electrode 15, the contact layers 14a, 14b and the electrodes 18, 17. The dielectric film 31 may be conveniently formed by using the CVD method similarly to the dielectric film formation in the other steps. However, in place thereof, another method such as the sol-gel method may be used.

Figure 7C:
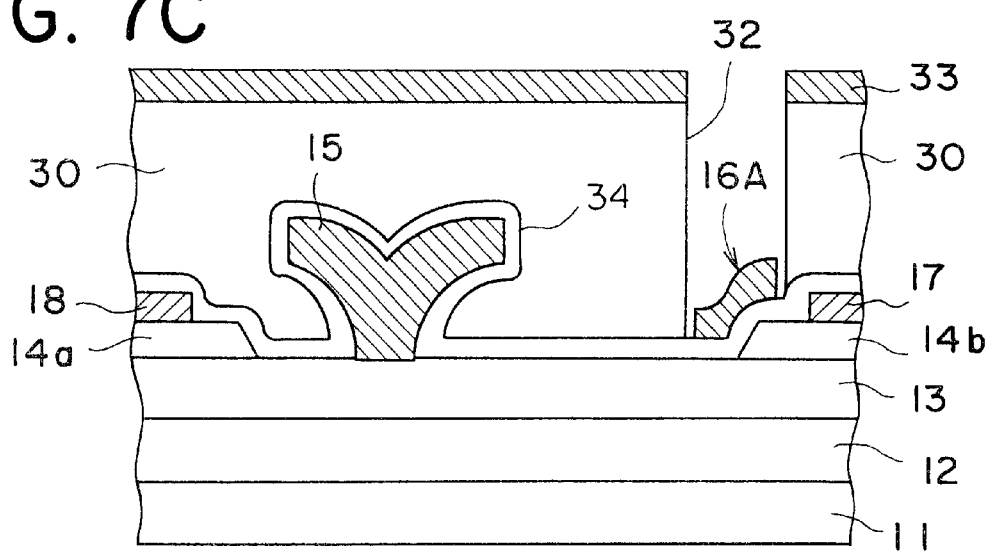

Then, as shown in FIG. 7C, a photomask 30 is evaporated on the dielectric film 31, and an opening 32 corresponding to the field plate 16A is formed by the patterning. A metal film 33 is formed on the photomask 30. The metal film 33 is also formed on the dielectric film 31 positioned in the bottom of the opening, thereby obtaining the field plate 16A in the opening 32. The configuration as shown in FIG. 7C can be obtained by removing the photomask 30 and the metal film 33 on the photomask 30.

Since the above embodiments are described only for examples, the present invention is not limited to the above embodiments and various modifications or alterations can be easily made therefrom by those skilled in the art without departing from the scope of the present invention.

What is claimed is:

1. A Schottky gate field effect transistor (FET) comprising:

a semi-insulating substrate;

a channel layer overlying the semi-insulating substrate;

a source contact layer and a drain contact layer formed on the channel layer and having a recess formed by removing part of the contact layers;

a gate electrode formed over the recess and being in Schottky contact with the channel layer;

a source electrode and a drain electrode in ohmic contact with the source contact layer and the drain contact layer, respectively; and a dielectric film formed between the gate electrode and the drain electrode, wherein the gate electrode includes a gate extension which is in contact with the dielectric film and extend to overlie at least part of the drain electrode and the drain contact layer, wherein the gate extension is 3.0 μm or above apart from an end of the drain electrode near to the gate electrode.

2. A Schottky gate field effect transistor (FET) comprising:

a semi-insulating substrate;

a channel layer overlying the semi-insulating substrate;

a source contact layer and a drain contact layer formed on the channel layer and having a recess formed by removing part of the contact layers;

a gate electrode formed over the recess and being in Schottky contact with the channel layer;

a source electrode and a drain electrode in ohmic contact with the source contact layer and the drain contact layer, respectively; and a dielectric film formed between the gate electrode and the drain electrode, wherein the gate electrode includes a gate extension which is in contact with the dielectric film and extend to overlie at least part of the drain electrode and the drain contact layer, and wherein a thickness of the dielectric film is from 50 to 200 nm.

3. A Schottky gate field effect transistor (FET) comprising:
- a semi-insulating substrate;
- a channel layer overlying the semi-insulating substrate;
- a source contact layer and a drain contact layer formed on the channel layer and having a recess formed by removing part of the contact layers;
- a gate electrode formed over the recess and being in Schottky contact with the channel layer;
- a source electrode and a drain electrode in ohmic contact with the source contact layer and the drain contact layer, respectively;
- a dielectric film formed between the gate electrode and the drain electrode; and
- a field plate overlying at least part of the drain electrode and the drain contact layer sandwiching the dielectric film,
- wherein the field plate is electrically connected to the gate electrode; and
- wherein the field plate is 3.0 µm or above apart from an end of the drain electrode near to the gate extension.

4. A Schottky gate field effect transistor (FET) comprising:
- a semi-insulating substrate;
- a channel layer overlying the semi-insulating substrate;
- a source contact layer and a drain contact layer formed on the channel layer and having a recess formed by removing part of the contact layers;
- a gate electrode formed over the recess and being in Schottky contact with the channel layer;
- a source electrode and a drain electrode in ohmic contact with the source contact layer and the drain contact layer, respectively;
- a dielectric film formed between the gate electrode and the drain electrode; and
- a field plate overlying at least part of the drain electrode and the drain contact layer sandwiching the dielectric film,
- wherein the field plate is electrically connected to the gate electrode; and
- wherein a thickness of the dielectric film is from 50 to 200 nm.

5. A Schottky gate field effect transistor (FET) comprising:
- a semi-insulating substrate;
- a channel layer overlying the semi-insulating substrate;
- a source contact layer and a drain contact layer formed on the channel layer and having a recess formed by removing part of the contact layers;
- a gate electrode formed over the recess and being in Schottky contact with the channel layer;
- a source electrode and a drain electrode in ohmic contact with the source contact layer and the drain contact layer, respectively;
- a dielectric film formed between the gate electrode and the drain electrode; and
- a field plate overlying at least part of the drain electrode and the drain contact layer sandwiching the dielectric film,
- wherein the field plate is electrically connected to the gate electrode;
- wherein the field plate is formed as a gate extension which is in contact with the dielectric film; and
- wherein the field plate is 3.0 µm or above apart from an end of the drain electrode near to the gate extension.

* * * * *